US009869737B2

(12) United States Patent  
Grinstead (10) Patent No.: US 9,869,737 B2  
(45) Date of Patent: Jan. 16, 2018

(54) METHODS AND SYSTEMS FOR ACCELERATED MR IMAGING

(71) Applicant: Siemens Healthcare GmbH, Erlangen OT (DE)

(72) Inventor: John William Grinstead, Portland, OR (US)

(73) Assignee: Siemens Healthcare GmbH, Erlangen (DE)

( * ) Notice: Subject to any disclaimer, the term of this patent is extended or adjusted under 35 U.S.C. 154(b) by 652 days.

(21) Appl. No.: 14/181,761

(22) Filed: Feb. 17, 2014

(65) Prior Publication Data

US 2014/0247046 A1 Sep. 4, 2014

Related U.S. Application Data

(60) Provisional application No. 61/771,971, filed on Mar. 4, 2013.

(51) Int. Cl.
*G01R 33/48* (2006.01)
*G01R 33/483* (2006.01)
*G01R 33/50* (2006.01)
*G01R 33/561* (2006.01)

(52) U.S. Cl.
CPC ......... *G01R 33/4835* (2013.01); *G01R 33/50* (2013.01); *G01R 33/5611* (2013.01)

(58) Field of Classification Search
CPC . G01R 33/50; G01R 33/4835; G01R 33/5611
See application file for complete search history.

(56) References Cited

U.S. PATENT DOCUMENTS

| 9,689,948 | B2* | 6/2017 | Ugurbil | G01R 33/5615 |
| 2011/0181283 | A1* | 7/2011 | Grinstead | G01R 33/5602 |
| | | | | 324/309 |
| 2012/0319686 | A1* | 12/2012 | Jesmanowicz | A61B 5/055 |
| | | | | 324/309 |

(Continued)

OTHER PUBLICATIONS

Controlled Aliasing in Volumetric Parallel Imaging (2D CAIPIRINHA), 2006.*

(Continued)

*Primary Examiner* — Clayton E Laballe
*Assistant Examiner* — Ruifeng Pu (57) ABSTRACT

A method for operating a Magnetic Resonance (MR) imaging system that includes generating radio frequency (RF) excitation pulses in a volume of patient anatomy and generating slice select magnetic field gradients for phase encoding and readout RF data acquisition in the patient anatomy. The method further includes concurrently acquiring $T_1$ map image data of slices of an image by: (i) acquiring image calibration data using a pre-scan sequence; (ii) inverting a longitudinal magnetization in the volume of patient anatomy using a non-selective inversion recovery pulse; (iii) applying an excitation RF pulse to different slices in the volume of patient anatomy to rotate a portion of the longitudinal magnetization in a transverse direction; (iv) sampling individual slice image data of the slices in response to applying the excitation RF pulse; and (v) separating the concurrently acquired $T_1$ map image into separate slices.

20 Claims, 7 Drawing Sheets

(56) References Cited

U.S. PATENT DOCUMENTS

| | | | | |
|---|---|---|---|---|
| 2013/0271128 A1* | 10/2013 | Duerk | ............... | G01R 33/5611 |
| | | | | 324/307 |
| 2014/0218026 A1* | 8/2014 | Moeller | ............... | G01R 33/561 |
| | | | | 324/309 |
| 2014/0225612 A1* | 8/2014 | Polimeni | ............ | G01R 33/4835 |
| | | | | 324/309 |
| 2015/0115958 A1* | 4/2015 | Wang | ................ | G01R 33/4835 |
| | | | | 324/309 |
| 2015/0323634 A1* | 11/2015 | Polimeni | ............ | G01R 33/5616 |
| | | | | 324/309 |
| 2015/0362574 A1* | 12/2015 | Wu | ................... | G01R 33/4835 |
| | | | | 324/322 |
| 2016/0007853 A1* | 1/2016 | Slavin | ................. | A61B 5/0044 |
| | | | | 600/413 |

OTHER PUBLICATIONS

Setsompop, et al, "Blipped-Controlled Aliasing in Parallel Imaging for Simultaneous Multislice Echo Planar Imaging With Reduced g-Factor Penalty", Magnetic Resonance in Medicine, 67:1210 (2012).

Grinstead, J., and W. Rooney. "Fast T1 Mapping in Human Brain Using Inversion Recovery EPI with GRAPPA at 3T and 7T." In Proceedings 16th Scientific Meeting, International Society for Magnetic Resonance in Medicine, Toronto, Toronto, Canada, p. 3084. 2008.

* cited by examiner

METHODS AND SYSTEMS FOR ACCELERATED MR IMAGING

CROSS-REFERENCE TO RELATED APPLICATIONS

The present application claims priority to U.S. provisional application Ser. No. 61/771,971 filed Mar. 4, 2013, which is incorporated herein by reference in its entirety.

TECHNOLOGY FIELD

The present application relates generally to methods, systems, and apparatuses for using concurrent multi-slice acquisitions in a Magnetic Resonance (MR) imaging system, and in particular, to methods, systems, and apparatuses for applying concurrent multi-slice acquisitions to accelerate spin-lattice relaxation time mapping.

BACKGROUND

Magnetic resonance (MR) imaging is a medical imaging technique that uses an applied magnetic field and radio frequency (RF) pulses to make images (e.g., via slices) of organs and structures inside the body. During MR imaging, the magnetic field causes magnetic field vectors of protons (typically in hydrogen atoms) to align with the magnetic field. The RF pulses cause the magnetic field vectors of the protons to be displaced (e.g., rotate) relative to the magnetic field and re-align with the magnetic field. An MRI scanner picks up signals from the protons in the body that result from magnetization field vectors re-aligning with the magnetic field. The signals may then be converted into images based on the location and strength of the incoming signals.

Relaxometry refers to the study and/or measurement of relaxation parameters in MR imaging. These relaxation parameters describe the recovery back to the equilibrium state of the object under investigation following a perturbation. Typical relaxation parameters are the spin-lattice relaxation time (typically called $T_1$) and the spin-spin relaxation time (commonly called $T_2$). These parameters depend on the physical properties of the substance under investigation.

MR relaxometry has competing requirements for speed, signal-to-noise ratio (SNR), resolution, anatomical coverage, and adequate sampling of the MR signal evolution for quantitative MR parameter fitting (e.g., the number of inversion times (TIs) that are measured following an inversion recovery (IR) pulse during quantitative $T_1$-mapping). Conventional systems for improving imaging speed have physical limitations resulting in the sacrifice of one requirement (e.g., the number of anatomical slices) for the benefit of another requirement (e.g., a large number of rapidly-acquired TIs to allow a robust $T_1$ fit). These conventional systems for improving the number of anatomical slices include parallel imaging by generalized auto-calibrating partially parallel acquisitions (GRAPPA) which has a penalty of reduced signal-to-noise ratio. These conventional systems also include interleaved multi-slice acquisitions. Different spin-histories and TI values may, however, occur for each slice during inversion recovery quantitative $T_1$-mapping imaging. Further, a lower number of TI measurements for each slice in the same scan time occur, which may reduce the accuracy of the quantitation.

SUMMARY

Embodiments provide a method for operating a Magnetic Resonance (MR) imaging system that includes generating radio frequency (RF) excitation pulses in a volume of patient anatomy to provide subsequent acquisition of associated RF echo data. The method also includes generating slice select magnetic field gradients for phase encoding and readout RF data acquisition in the patient anatomy. The method further includes concurrently acquiring $T_1$ map image data of a plurality of two dimensional slices of an image by an acquisition process that includes: (i) acquiring image calibration data using a pre-scan sequence; (ii) inverting a longitudinal magnetization in the volume of patient anatomy using a non-selective inversion recovery pulse; (iii) applying an excitation RF pulse to a plurality of different two dimensional slices in the volume of patient anatomy to rotate a portion of the longitudinal magnetization in a transverse direction; (iv) sampling individual slice image data of the plurality of two dimensional slices in response to applying the excitation RF pulse; and (v) separating the concurrently acquired $T_1$ map image into separate slices.

According to one embodiment, acquiring the image calibration data using the pre-scan sequence further includes acquiring each slice separately to estimate a k-space data kernel that separates the concurrently acquired $T_1$ map image data into the separate slices.

According to another embodiment, the $T_1$ map image data is acquired within the volume of anatomy during individual TI times for a plurality of successive TI times during inversion recovery time of the volume of anatomy to provide image data representing a plurality of successive images of an individual slice during the inversion recovery time.

In an aspect of an embodiment, the method further includes processing individual luminance data values of an individual pixel location or a combination of luminance data values over a collection of pixel locations occurring within the plurality of successive images of the individual slice and providing a composite individual pixel luminance value and a composite $T_1$ map for the individual slice.

In one embodiment, the method further includes concurrently acquiring the $T_1$ map image data in response to a signal indicating start of introduction of contrast agent into a patient vessel.

In another embodiment, the method further includes generating a display image showing images representing individual slices of said plurality of slices aligned with a common timeline facilitating comparison of the plurality of slices.

According to one embodiment, the method further includes generating a display image showing a minimum-intensity projection along the TI-axis to provide a global measure of the inversion effectiveness.

According to another embodiment, the method further includes comprising generating a display image showing a time-to-minimum (TTM) pixel intensity facilitating a monotonic function of the pixel $T_1$ without using nonlinear fitting.

In one embodiment, the method further includes concurrently acquiring $T_1$ map image data for a plurality of different selective inversion recovery pulses.

In yet another embodiment, the method further includes inducing slice-dependent in-plane image shifts between the simultaneously acquired slices to improve image reconstruction.

Embodiments provide an accelerated Magnetic Resonance (MR) image system, that includes a radio frequency (RF) signal generator configured to generate RF excitation pulses in a volume of anatomy and provide subsequent acquisition of associated RF echo data and a magnetic field gradient generator configured to generate slice select magnetic field gradients for phase encoding and readout RF data acquisition in the volume of anatomy, the RF signal generator and the gradient generator configured. The image system also includes a plurality of RF coils configured to acquire a plurality of two dimensional slices of an image. The method further includes a controller configured to cause the plurality of RF coils to concurrently acquire longitudinal relaxation time ($T_1$) image data of a plurality of different two dimensional slices within the volume of anatomy by causing the RF signal generator and the magnetic field generator to use: (i) a preparation pre-scan sequence for acquisition of image calibration data for use in separating concurrently acquired multiple slice $T_1$ map data into separate slices; (ii) a non-selective inversion recovery pulse to invert longitudinal magnetization in the volume of anatomy; (iii) an excitation RF pulse applied to said plurality of different two dimensional slices in the volume of anatomy to rotate a portion of longitudinal magnetization in a transverse direction; and (iv) echo-planar-imaging (EPI) acquisition sampling of $T_1$ map data of individual slices of the plurality of slices in response to the application of the excitation RF pulse.

According to one embodiment, the image calibration data is acquired for each slice separately to estimate a k-space data kernel used to separate the concurrently acquired multiple slice $T_1$ map data into the separate slices.

According to another embodiment, the RF signal generator and the gradient generator acquire $T_1$ map image data of the plurality of different two dimensional slices within said volume of anatomy during individual TI times for a plurality of successive TI times during an inversion recovery time of said volume of anatomy to provide image data representing a plurality of successive images of an individual slice during the inversion recovery time.

In one embodiment, the image system further includes an image data processor configured to: (i) process data for a plurality of individual pixel locations for each of the plurality of successive images; and (ii) process individual luminance data values of an individual pixel location occurring within the plurality of successive images to provide a composite individual pixel luminance value and a composite $T_1$ map.

In another embodiment, the image system further includes an image data processor configured to fit a kernel to each slice of a pre-scan calibration dataset acquired one slice at a time and apply each kernel fit to each slice to estimate the k-space data of each individual imaging slice from collapsed slices.

According to one embodiment, the RF signal generator and the gradient generator concurrently acquire $T_1$ map image data in response to a signal indicating a start of introduction of a contrast agent into a patient vessel.

According to another embodiment, the image system further includes a display processor configured to generate a display image showing images representing individual slices of the plurality of slices aligned with a common timeline facilitating comparison of the plurality of slices.

In yet another embodiment, the RF signal generator and the gradient generator concurrently acquire $T_1$ map image data for a plurality of different non-selective inversion recovery pulses.

Embodiments provide an article of manufacture for operating a multi-slice, multi-segment magnetic resonance (MR) imaging system. The article of manufacture includes a non-transitory, tangible computer-readable medium holding computer-executable instructions for performing a method that includes generating radio frequency (RF) excitation pulses in a volume of patient anatomy to provide subsequent acquisition of associated RF echo data and generating slice select magnetic field gradients for phase encoding and readout RF data acquisition in the patient anatomy. The method also includes concurrently acquiring $T_1$ map image data of a plurality of two dimensional slices of an image by an acquisition process comprising: (i) acquiring image calibration data using a pre-scan sequence; (ii) inverting a longitudinal magnetization in the volume of patient anatomy using a non-selective inversion recovery pulse; (iii) applying an excitation RF pulse to a plurality of different two dimensional slices in the volume of patient anatomy to rotate a portion of the longitudinal magnetization in a transverse direction; (iv) sampling individual slice image data of the plurality of two dimensional slices in response to applying the excitation RF pulse; and (v) separating the concurrently acquired $T_1$ map image into separate slices.

According to one embodiment, acquiring the image calibration data using the pre-scan sequence further includes acquiring each slice separately to estimate a k-space data kernel that separates the concurrently acquired $T_1$ map image data into the separate slices.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Terms and Concepts Associated with Some Embodiments

Echo planar imaging involves image acquisition whereby a complete image is formed from a single RF excitation (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as $T_1$ weighted, or $T_2$ weighted). Adiabatic IR pulses are used to give more uniform contrast throughout an imaging volume than non-adiabatic RF pulses.

TI comprises inversion time, the time between an inversion recovery pulse and the next RF excitation pulse. TI influences the image contrast.

$T_1$ comprises the longitudinal (or spin-lattice) relaxation time $T_1$ decay constant.

$T_2$ comprises the transverse (or spin-spin) relaxation time $T_2$ decay constant.

TR comprises the repetition time, the time between successive RF excitation pulses.

Exemplary Embodiments

The signal behavior of an MR imaging system is dependent on various intrinsic tissue-specific MR parameters, including spin density, the longitudinal recovery rate constant $T_1$, and the transverse decay rate constant $T_2$. Typical MR imaging, such as magnetization-prepared rapid acquisition gradient echo (MPRAGE) may be "$T_1$-weighted" by adjusting pulse sequence timing so image signal intensity is primarily proportional to $T_1$. The amount of $T_1$-contrast, however, depends on the exact MR pulse sequence and specific protocol used. Quantitative $T_1$-mapping refers to methods that calculate the true $T_1$ of each tissue. A $T_1$-map is desirably independent of parameters such as the pulse sequence used, protocol parameters and scanner, for example and is a tissue-specific parameter. $T_1$ and $T_2$ mapping are generically referred to as relaxometry because they are relaxation rate constants.

Some MR relaxometry methods include quantitative $T_1$ mapping using inversion recovery ($qT_1$-IR). These techniques measure the MR signal as a function of the time after an inversion recovery (TI). These measurements may then be fit to an appropriate relaxation model (e.g., to an exponential recovery model) to compute the $T_1$ (the rate constant of the exponential recovery, in this case) at each pixel or over a collection of pixels. The resulting data can then be represented as a $T_1$ map (also called a quantitative $T_1$ image).

One conventional method ($qT_1$-IR) with very fast sampling of the magnetization recovery includes an inversion pulse followed by a series of rapid single-slice low flip-angle pulses (e.g., Look-Locker; LL) and EPI readout, which can sample inversion times (TI) every 50-100 ms depending on the spatial resolution. This technique is referred to here as LL-IR-EPI. Such rapid TI sampling allows the modeling of multi-exponential $T_1$ recovery, and can be fast enough (less than 3 seconds) to support dynamic $T_1$ mapping during contrast injection. For some applications, EPI can be limited by image distortions, ghosting, and susceptibility artifacts, in which case TurboFLASH (TFL) may be preferred (referred to here as LL-IR-TFL). Although TFL has better image quality than EPI, it is slower and may only achieve TI measurements spaced every ~250-500 ms. Both of these single-slice approaches have low SNR because of the small flip-angles required for the short repetition times (TR) used.

Other conventional methods, full coverage of the anatomy of interest is more important than rapid TI sampling and scan time. For example, one such method includes a non-selective IR pulse followed by a two-dimensional (2D) multi-slice echo-planar imaging (EPI), which is repeated with the EPI slice acquisition order permuted each time such that each slice experiences a different effective TI within each repetition (referred to here as shuffled-IR-EPI), which can achieve, for example, $T_1$ maps with 16-64 slices having 16-64 TI points in 3-10 minutes. The SNR is high because a large flip-angle excitation pulse (90°) can be used with the typically long TR.

Slice-accelerated multi-slice techniques (sometimes referred to as "multiband") utilize RF pulses which excite multiple 2D slices simultaneously. As all of k-space is still measured, slice-acceleration has the benefit of acquiring more slices per unit time without the SNR penalty associated with parallel imaging or partial Fourier approaches. Some conventional acquisition and image reconstruction methods (such as slice-GRAPPA) have made slice-acceleration practical for applications such as functional MRI and diffusion tensor imaging (DTI), but have not been extended to MR relaxometry.

Embodiments include systems and methods that provide improved data quality for MR relaxometry. Embodiments include systems and methods that provide more accurate $T_1$-maps. Embodiments apply concurrent multi-slice EPI acquisitions to accelerate multi-slice $T_1$-mapping, while still maintaining the same rapid sampling of the inversion recovery curve for a single-slice $T_1$-mapping measurement.

Embodiments of the present invention include systems and methods for accelerating quantitative MR imaging, improving the number of slices acquired and sampling MR signal evolution using concurrent multi-slice acquisitions. Embodiments of the present invention apply concurrent multi-slice acquisitions to accelerate $T_1$-mapping using, for example, slice-accelerated multi-band RF excitation pulses and associated blipped-controlled aliasing image reconstruction. Embodiments of the present invention concurrently image multiple acquired anatomical slices while still maintaining the speed for imaging as a single-slice measurement.

Embodiments of the present invention include systems and methods that avoid the signal-to-noise ratio (SNR) penalty associated with the reduced imaging time of parallel imaging. Embodiments of the present invention provide flexibility using multi-slice excitation for quantitative imaging may advantageously use interleaved slice acquisition as well as parallel imaging to further accelerate image acquisition.

Embodiments of the present invention include systems and methods that improve usability of quantitative $T_1$-mapping used clinically in musculoskeletal (MSK) applications. Embodiments provide a more advanced and flexible mapping method that improves MSK imaging as well as other applications such as neurological, liver, and cardiac quantitative mapping.

Figure 1:
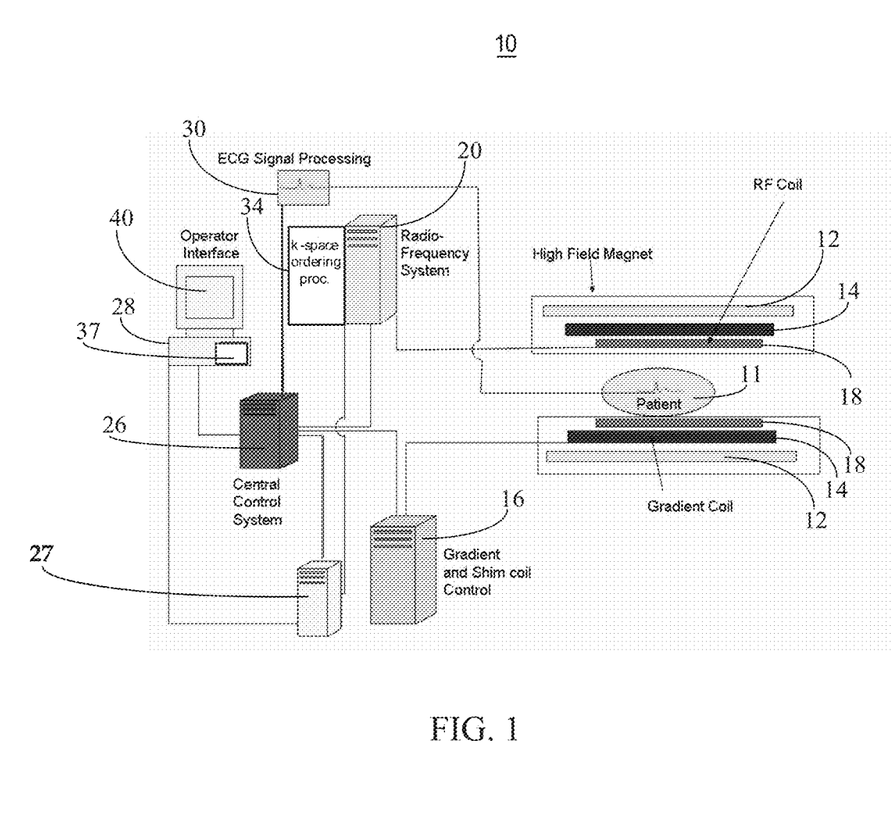
FIG. 1 is a system block diagram illustrating a system for operating a Magnetic Resonance (MR) imaging system, for use with embodiments disclosed herein.

FIG. 1 is a system block diagram illustrating a system 10 using concurrent multi-slice acquisitions for use with embodiments disclosed herein. As shown at FIG. 1, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase encoding gradient magnetic field and a readout gradient magnetic field that are applied to patient 11.

Further, radio frequency (RF) module 20 provides RF pulse signals to RF coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16, in conjunction with RF module 20 as directed by central control unit 26, control slice-selection, phase encoding, readout gradient magnetic fields, radio frequency transmission, and magnetic resonance signal detection to acquire magnetic resonance signals representing planar slices of patient 11.

In response to applied RF pulse signals, the RF coils 18 receive data, such as MR signals. For example, RF coils 18 may receive signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. In some embodiments, the image data processor (e.g. image data processor 27) may be external to the central control unit 26. ECG synchronization signal generator 30 provides ECG signals used for pulse sequence and imaging synchronization. A two or three dimensional (3D) k-space storage array of individual data elements in unit 34 stores corresponding individual frequency components comprising a MR dataset.

A RF signal generator comprising module 20 and RF coils 18 generates RF excitation pulses in anatomy of patient 11 and enables subsequent acquisition of associated RF echo data. A magnetic field gradient generator (comprising magnetic coils 12 and 14) generates a magnetic field for use in acquiring multiple individual frequency components and generates magnetic field gradients for anatomical slice selection, phase encoding and readout RF data acquisition in a 3D anatomical volume. The RF signal generator units 18 and 20 and the magnetic field gradient generator units 12 and 14 provide a rotating frame preparation pulse sequence comprising at least one of: (a) a $T_1$ spin lattice relaxation in a rotating frame ($T_1\rho$) preparation pulse sequence of adiabatic pulses comprising modulated RF pulses and modulated magnetic field gradients for slice selection; and (b) a $T_2$ spin-spin relaxation in a rotating frame ($T_2\rho$) preparation pulse sequence of adiabatic pulses comprising modulated RF pulses and modulated magnetic field gradients for slice selection.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data, as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

In some embodiments, system 10 may include a Siemens MAGNETOM 7T MRI scanner for acquiring data, including acquiring slices of data. The scanner may use a Nova Medical 24-channel head coil. Embodiments may, however, use other scanners during MR imaging.

Figure 2:
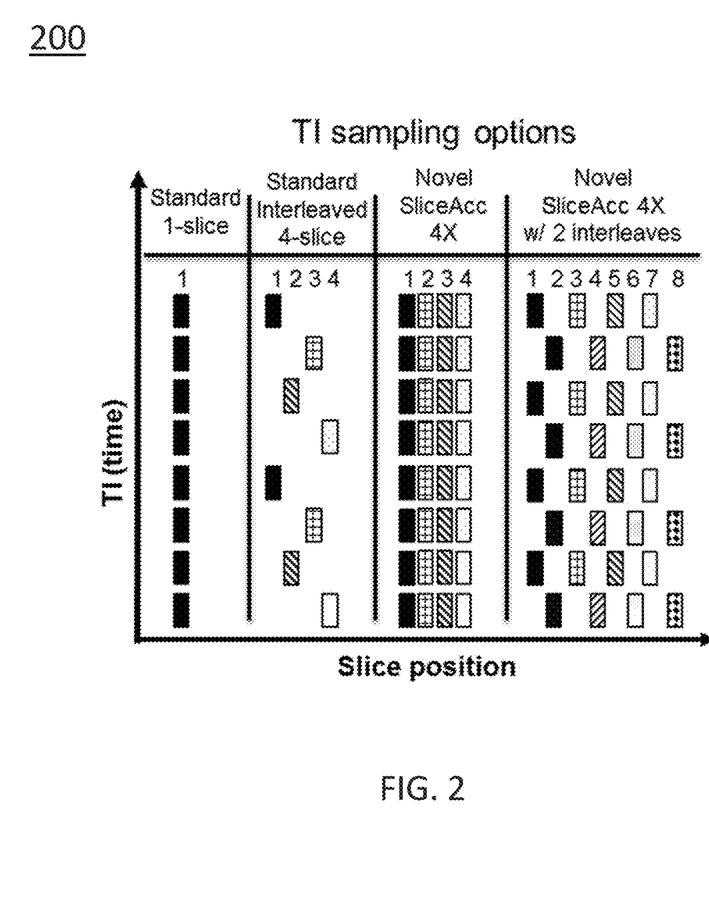
FIG. 2 is a diagram illustrating the effect of the number of slices on the shortest achievable TI spacing and the reduction of spacing from multi-slice excitation according to embodiments of the invention.

FIG. 2 is a diagram 200 illustrating the effect of the number of slices on the shortest achievable TI spacing and the reduction of spacing from multi-slice excitation according to embodiments of the invention. Column 1 shows the number of slices that may be achieved using single slicing. Column 2 shows the number of slices that may be achieved using interleaved 4-slicing. Column 3 shows the number of slices that may be achieved using 4× multi-slicing. Column 4 shows the number of slices that may be achieved using (novel 4×2-slice'), which combines 4× multi-slices with standard interleaving, which is used according to the embodiments described herein. Other multi-slice acquisition methods, may, however, be used.

According to some embodiments, concurrent multi-slice acquisitions may be performed by using calibration pre-scans at the beginning of a measurement. The pre-scan calibration data is acquired for each slice separately to estimate a kernel which may then be used to untangle the subsequent concurrently acquired slices. A slice-GRAPPA algorithm fits a GRAPPA-like kernel to each slice of a pre-scan calibration dataset acquired one slice at a time and applies these kernels to estimate the k-space data of each individual imaging slice from the collapsed slices. Thus, for a slice-acceleration factor of 3, three separate sets of GRAPPA kernels are fitted and applied, one for each imaging slice. Following the calibration pre-scan, a spatially-global inversion pulse may be applied. In one embodiment of the invention, which is analogous to LL-IR-EPI, a series of slice-accelerated EPI imaging scans simultaneously measures N slices (for a slice-acceleration factor of N) after a time period $TI_1$ following the IR pulse.

Figure 3:
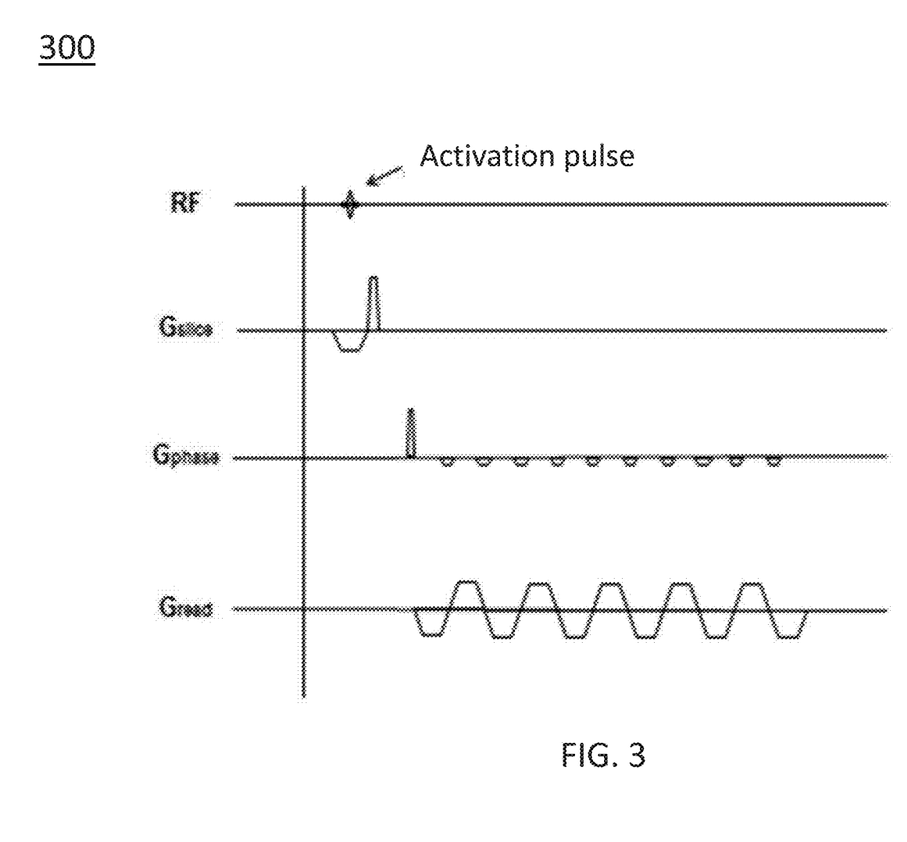
FIG. 3 is a pulse sequence diagram showing a 2D single-slice gradient-echo EPI for illustrating embodiments of the invention.
Figure 4:
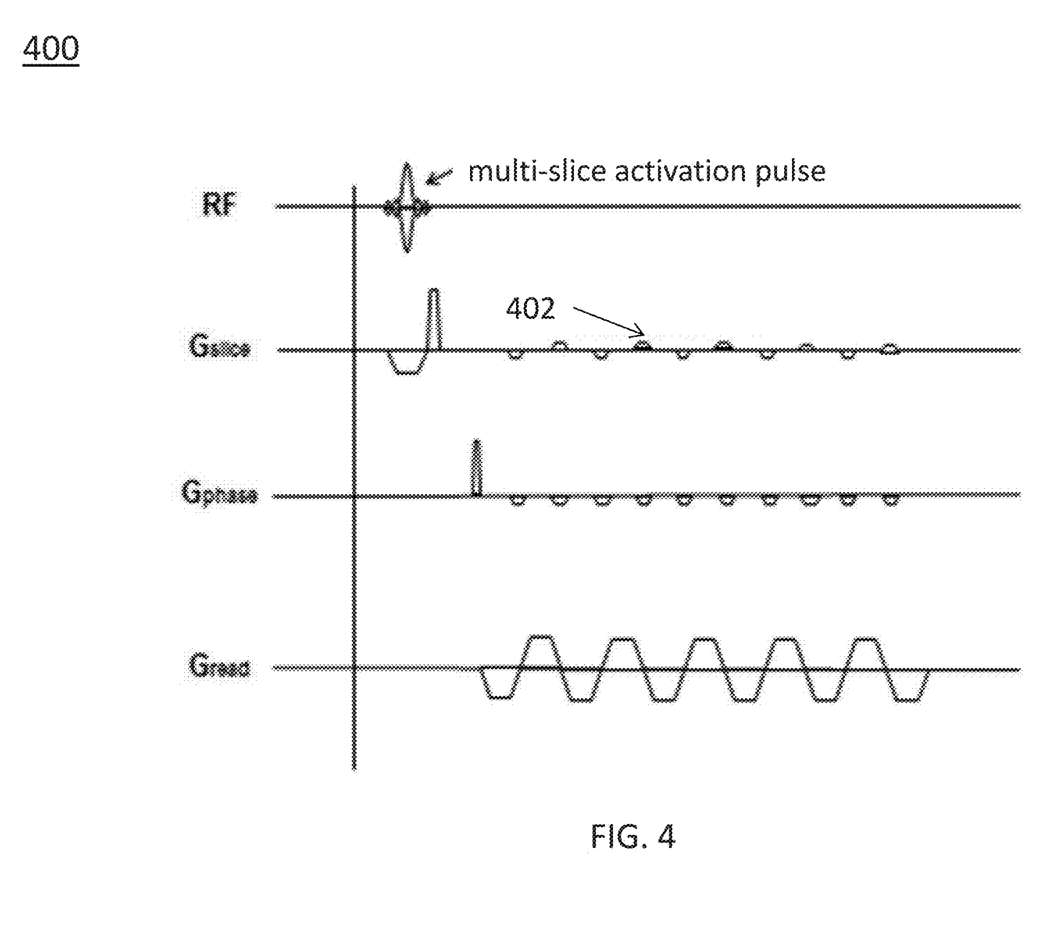
FIG. 4 is a pulse sequence diagram for a slice-accelerated 2D single-slice gradient-echo EPI for illustrating embodiments of the invention.

FIG. 3 is a pulse sequence diagram 300 illustrating a 2D single-slice gradient-echo EPI, where $G_{slice}$ $G_{phase}$ $G_{read}$ comprise $G_x$ $G_y$ $G_z$. FIG. 4 is a pulse sequence diagram 400 for a slice-accelerated 2D single-slice gradient-echo EPI. $G_{slice}$ $G_{phase}$ $G_{read}$ comprise $G_x$ $G_y$ $G_z$. In some embodiments, each slice-accelerated imaging scan may be substantially the same as for the 2D single-slice gradient-echo EPI shown in FIG. 3, except the imaging uses a special multi-slice RF excitation pulse to excite multiple slices simultaneously.

Some embodiments include inducing slice-dependent in-plane image shifts between the simultaneously acquired slices to improve image reconstruction. In some aspects, RF Controlled Aliasing In Parallel Imaging (CAIPI) may be used to introduce in-plane image shifts for FLASH imaging. In other aspects, blipped-CAIPI gradients 402 may be used to introduce an in-plane image shift (for EPI imaging) between the simultaneously acquired slices to improve image reconstruction, as shown in pulse sequence diagram 400 at FIG. 4. The imaging scans may then be repeated to measure all N slices again at a time point $TI_2$. Imaging scans may be repeated until the desired number of TI points are measured which adequately sample the inversion recovery.

$T_1$ map image data may be concurrently acquired for a plurality of different selective inversion recovery pulses multiple slice-selective. Thicker slab-selective pulses may also be used, which may invert some, but not all, of the imaging volume. Concurrent acquisition of the $T_1$ map image data may be useful for certain applications (e.g., when you do not want to invert blood outside your imaging volume).

If dynamic $T_1$ mapping is desired, additional $T_1$ maps can be measured by first waiting an optional magnetization recovery period, after which another inversion pulse is applied, and the imaging scans are repeated again. Imaging scans may be repeated as many times as appropriate. In some aspects, the calibration scans are acquired before the very first repetition. In conventional image reconstruction, the simultaneously measured slices may be overlapped on top of each other. Accordingly, the images at each TI may be reconstructed using the kernel calculated by the slice-GRAPPA algorithm, yielding separate images for each slice and TI.

The parametric $T_1$ map may be calculated for each slice using the image signal intensity as a function of TI. Embodiments may include: (1) fitting the data at each individual pixel to the T1 model; and (2) fitting the data that is combined from a collection of pixels. The calculation from averaging a collection of pixels may create a much higher SNR at the expense of spatial resolution in the T1 map. Calculating the $T_1$ parameter values for a given pixel (or a combination of multiple pixels) may include the numerical estimation of the parameters $M_0$ and $T_1$ of the functional form $f(TI)=abs(M_0*[1-2*exp(-T_1/TI)])$, where f is the pixel luminance as a function of the inversion time 'TI', 'abs' is the modulus operation, and $M_0$ is the pixel luminance where TI approaches infinity. The parameters $M_0$ and $T_1$ can be estimated using a standard implementation of the iterative nonlinear least-squares (NLLS) Marquardt-Levenberg algorithm. The starting values for the first iteration can be initialized such that $M_0$ equals the pixel luminance of the largest measured TI, and $T_1$ equals the average of the expected $T_1$ values for the physical object being imaged to provide robust convergence of the numerical algorithm to the correct solution. Because all slices can be acquired with the same TI, the same starting parameter values may be expected to work similarly for all slices.

Figure 5:
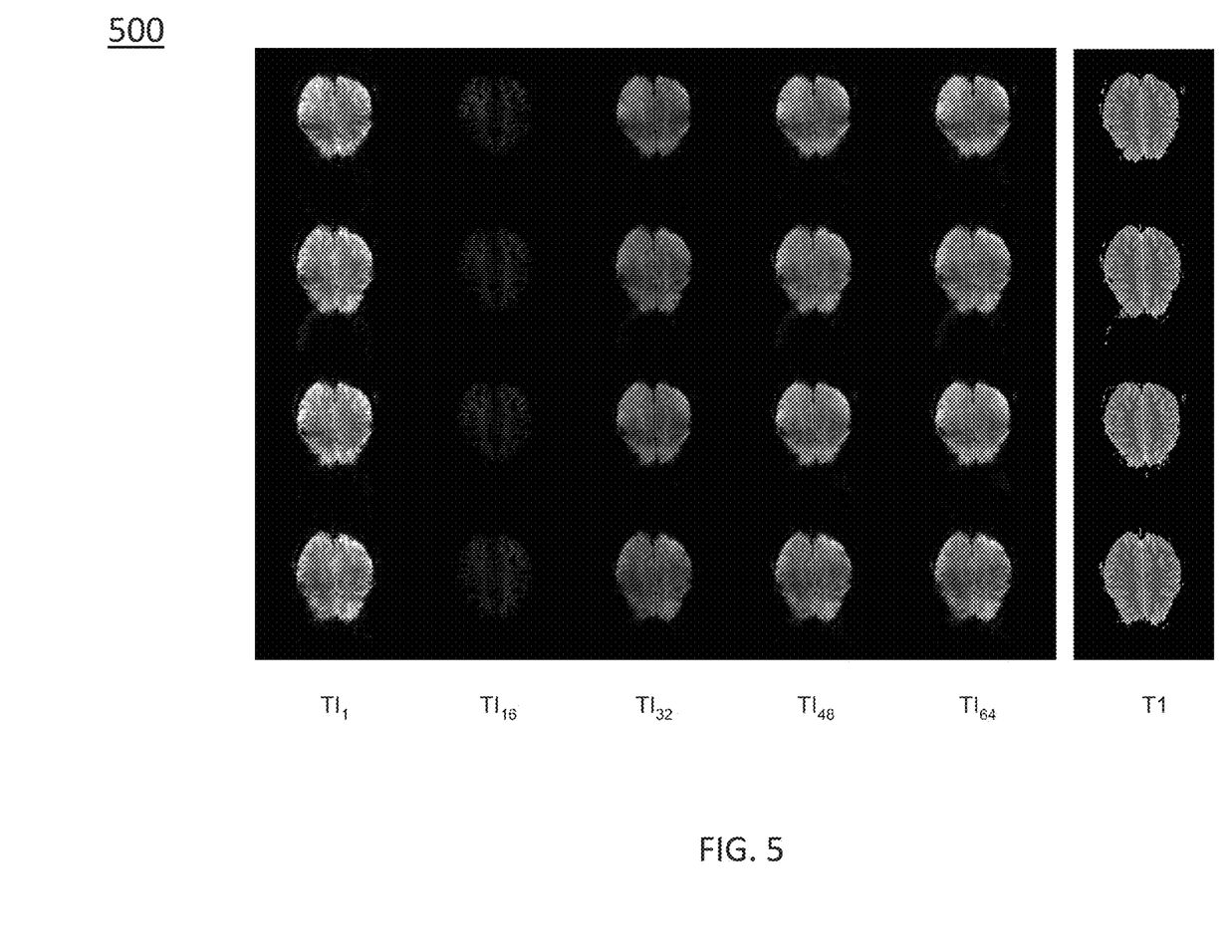
FIG. 5 is an illustration showing data acquired using a slice-acceleration factor of 4 according to embodiments of the invention.

In one embodiment shown in illustration 500 at FIG. 5, which is analogous to a slice-accelerated version of LL-IR-EPI, data representing four simultaneous image slices (slice-acceleration factor of 4) using the concurrent multi-slice method and LL-IR-EPI includes 64 TIs spaced equally over a TI range from 21 ms to 6400 ms. As shown in FIG. 5, five ($TI_1$, $TI_{16}$, $TI_{32}$, $TI_{48}$ and $TI_{64}$) of the 64 measured TI points are displayed for all four slices, as well as the computed $T_1$ map for each slice. The measurement is performed in the same amount of time and with the same TI spacing as for a standard single-slice measurement (see FIG. 2, 'Standard 1-slice' compared to 'Novel SliceAcc 4×').

In another embodiment, which is analogous to a slice-accelerated version of shuffled-IR-EPI, both interleaved and simultaneously acquired slices may be measured. The slice acquisition order may be permuted during each repetition to change the inversion time for each slice. For example, using a slice-acceleration factor of 3, and 15 slice-interleaves (see FIG. 1 for an example of 2 slice-interleaves), a total of 45 slices could be measured using an EPI readout. If the measurement is repeated (up to) 15 times and the slice order is permuted each time, a total of (up to) 15 TI points could be measured for each slice.

Figure 6:
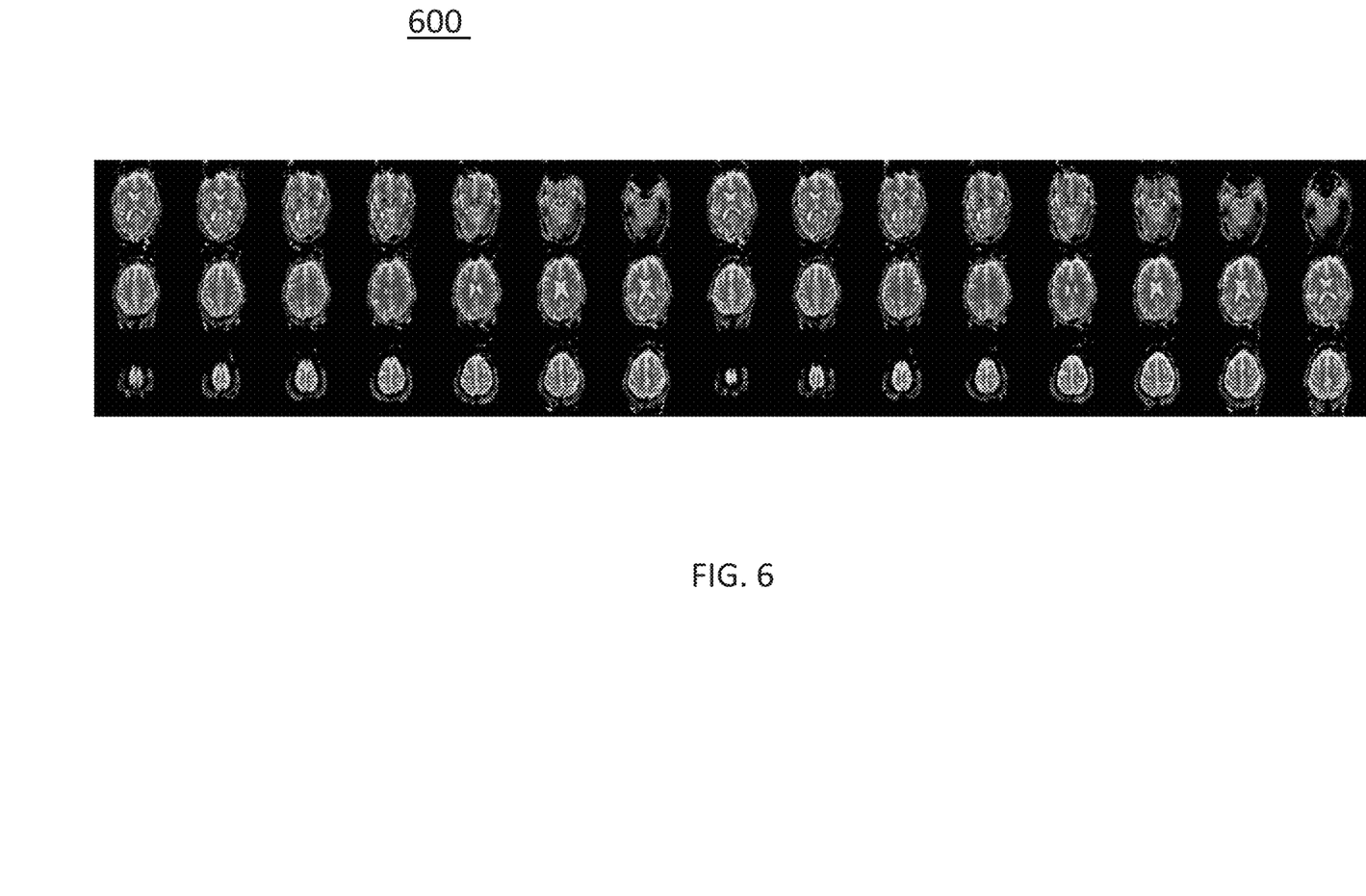
FIG. 6 is an illustration of a computed $T_1$ map of a brain for 45 slices acquired using a slice-acceleration factor of 3 and shuffled-IR-EPI using 15 TI points according to embodiments of the invention.

FIG. 6 is an illustration 600 of a computed $T_1$ map of a brain for 45 slices acquired using a slice-acceleration factor of 3 and shuffled-IR-EPI using 15 TI points spaced equally over a TI range from 32 ms to 6000 ms. The illustration shown in FIG. 6 includes 15 columns, each column showing three slices simultaneously acquired. The shuffled-IR-EPI benefits from the extra flexibility that slice-acceleration provides in the number of measured slices and TI samples possible in a given scan time, which may be advantageous over conventional imaging methods.

The embodiments described herein are not limited to $T_1$-mapping. Embodiments may also provide multi-slice $T_2*$ and $T_2$-mapping, for example. The embodiments described herein are not limited to EPI. Embodiments may also be used for other imaging, such as TurboFLASH and turbo spin-echo. In some aspects, RF-CAIPI field of view shifting may be used to introduce an in-plane image shift between the simultaneously acquired slices to improve image reconstruction.

In some embodiments, because of the concurrent measurement of slices for each TI, the images of multiple slices can be arranged in a mosaic format and viewed as a cine sequence over a TI-axis, to facilitate a qualitative visualization of the inversion recovery over the slices simultaneously. In one embodiment, the system may perform a minimum-intensity projection along the TI-axis and displays a mosaic of slices which provides a global measure of the inversion effectiveness in the case of a small TI-spacing compared to $T_1$. When the inversion recovery pulse is effective, the projection mosaic image is uniformly dark. When experimental conditions cause the inversion pulse to perform sub-optimally (such as being significantly off-resonance from an MR center frequency), the image is not uniformly dark. A time-to-minimum (TTM) pixel intensity is calculated for the mosaic of the slices. This quantity is a monotonic function of the pixel $T_1$, but does not require nonlinear fitting methods and therefore does not have problems with numerical convergence to a correct solution, and is quickly calculated. If P(x, y, TI) is the pixel luminance as a function of the pixel location (x, y) at time TI, TTM=min(P, 3); where t=min(f, n) returns the location t, where the minimum of the function f occurs along the dimension n.

Figure 7:
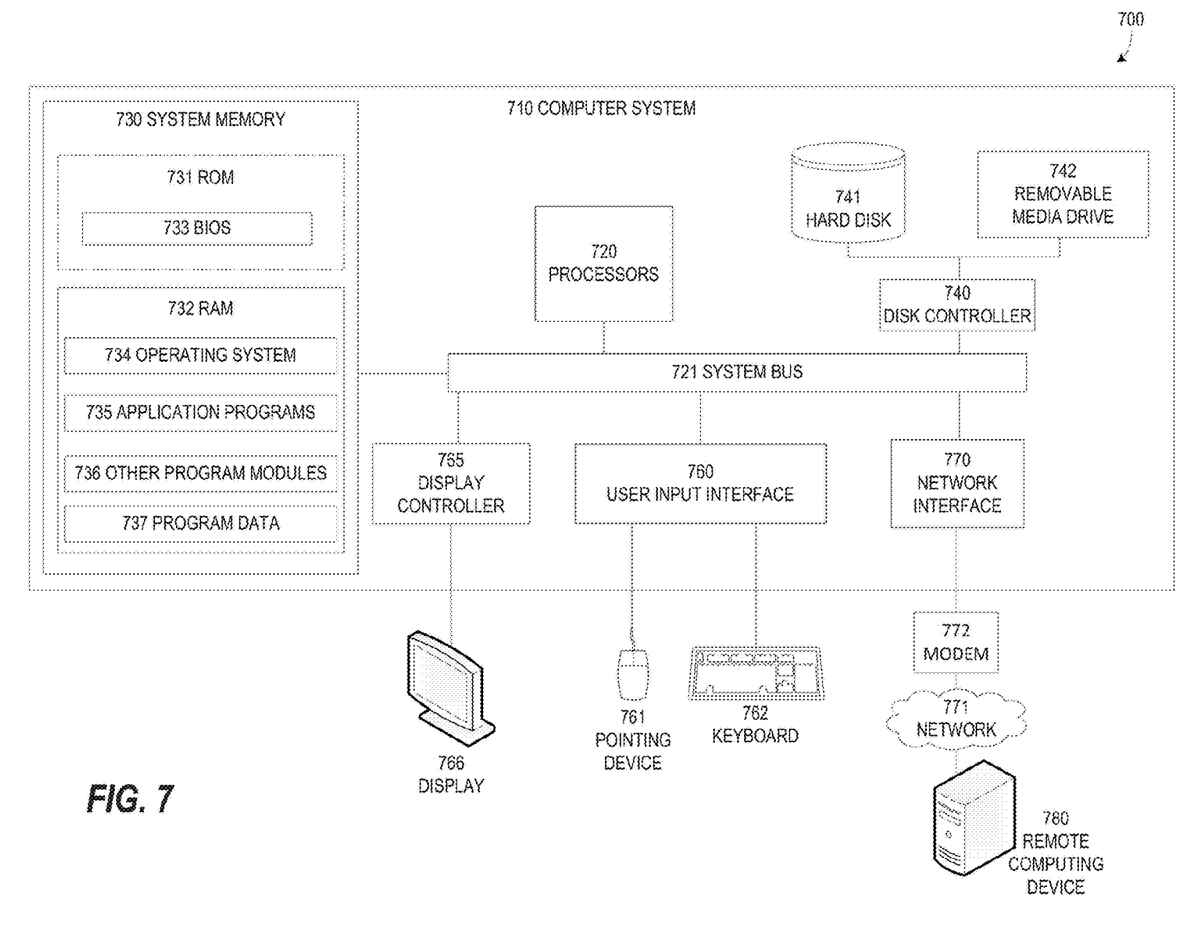
FIG. 7 illustrates an example of a computing environment within which embodiments of the invention may be implemented.

FIG. 7 illustrates an example of a computing environment 700 within which embodiments of the invention may be implemented. Computing environment 700 may include computer system 710, which is one example of a computing system upon which embodiments of the invention may be implemented. As shown in FIG. 7, the computer system 710 may include a communication mechanism such as a bus 721 or other communication mechanism for communicating information within the computer system 710. The system 710 further includes one or more processors 720 coupled with the bus 721 for processing the information. The processors 720 may include one or more CPUs, GPUs, or any other processor known in the art.

The computer system 710 also includes a system memory 730 coupled to the bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device (s) (e.g., programmable ROM, erasable PROM, and electrically erasable PROM). In addition, the system memory 730 may be used for storing temporary variables or other intermediate information during the execution of instructions by the processors 720. A basic input/output system (BIOS) 733 including the basic routines that help to transfer information between elements within computer system 710, such as during start-up, may be stored in ROM 731. RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the bus 721 to control one or more storage devices for storing information and instructions, such as a magnetic hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the bus 721 to control a display or monitor 766, such as a cathode ray tube (CRT) or liquid crystal display (LCD), for displaying information to a computer user. The computer system includes an input interface 760 and one or more input devices, such as a keyboard 762 and a pointing device 761, for interacting with a computer user and providing information to the processor 720. The pointing device 761, for example, may be a mouse, a trackball, or a pointing stick for communicating direction information and command selections to the processor 720 and for controlling cursor movement on the display 766. The display 766 may provide a touch screen interface which allows input to supplement or replace the communication of direction information and command selections by the pointing device 761.

The computer system 710 may perform a portion or all of the processing steps of embodiments of the invention in response to the processors 720 executing one or more sequences of one or more instructions contained in a memory, such as the system memory 730. Such instructions may be read into the system memory 730 from another computer readable medium, such as a hard disk 741 or a removable media drive 742. The hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according to embodiments of the invention and for containing data structures, tables, records, or other data described herein. The term "computer readable medium" as used herein refers to any non-transitory, tangible medium that participates in providing instructions to the processor 720 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 741 or removable media drive 742. Non-limiting examples of volatile media include dynamic memory, such as system memory 730. Non-limiting examples of transmission media include coaxial cables, copper wire, and fiber optics, including the wires that make up the bus 721. Transmission media may also take the form of acoustic or light waves, such as those generated during radio wave and infrared data communications.

The computing environment 700 may further include the computer system 710 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer 710. When used in a networking environment, computer 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing system 780). The network 771 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The GUI also includes an executable procedure or executable application. The executable procedure or executable application conditions the display processor to generate signals representing the GUI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the GUI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of the figures presented herein are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIG. 7. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

Although the invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

The invention claimed is:

1. A method for operating a Magnetic Resonance (MR) imaging system, the method comprising:
   generating radio frequency (RF) excitation pulses in a volume of patient anatomy to provide subsequent acquisition of associated RF echo data;
   generating slice select magnetic field gradients for phase encoding and readout RF data acquisition in the patient anatomy;
   concurrently acquiring $T_1$ map image data of a plurality of two dimensional slices of an image by an acquisition process comprising:
   (i) acquiring image calibration data using a pre-scan sequence;
   (ii) inverting a longitudinal magnetization in the volume of patient anatomy using a non-selective inversion recovery pulse;
   (iii) applying an excitation RF pulse to a plurality of different two dimensional slices in the volume of patient anatomy to rotate a portion of the longitudinal magnetization in a transverse direction;
   (iv) sampling individual slice image data of the plurality of two dimensional slices in response to applying the excitation RF pulse; and
   (v) separating the concurrently acquired $T_1$ map image into separate slices.

2. The method according to claim 1, wherein acquiring the image calibration data using the pre-scan sequence further comprises acquiring each slice separately to estimate a k-space data kernel that separates the concurrently acquired $T_1$ map image data into the separate slices.

3. The method according to claim 2, wherein the $T_1$ map image data is acquired within the volume of anatomy during individual TI times for a plurality of successive TI times during inversion recovery time of the volume of anatomy to provide image data representing a plurality of successive images of an individual slice during the inversion recovery time.

4. The method according to claim 3, further comprising:
   processing individual luminance data values of an individual pixel location or a combination of luminance data values over a collection of pixel locations occurring within the plurality of successive images of the individual slice; and
   providing a composite individual pixel luminance value and a composite $T_1$ map for the individual slice.

5. The method according to claim 1, further comprising concurrently acquiring the $T_1$ map image data in response to a signal indicating start of introduction of contrast agent into a patient vessel.

6. The method according to claim 1, further comprising generating a display image showing images representing individual slices of said plurality of slices aligned with a common timeline facilitating comparison of the plurality of slices.

7. The method according to claim 1, further comprising generating a display image showing a minimum-intensity projection along the TI-axis to provide a global measure of the inversion effectiveness.

8. The method according to claim 1, further comprising generating a display image showing a time-to-minimum (TTM) pixel intensity facilitating a monotonic function of the pixel $T_1$ without using nonlinear fitting.

9. The method according to claim 1, further comprising concurrently acquiring $T_1$ map image data for a plurality of different selective inversion recovery pulses.

10. The method according to claim 1, further comprising inducing slice-dependent in-plane image shifts between the simultaneously acquired slices to improve image reconstruction.

11. An accelerated Magnetic Resonance (MR) image system, comprising:
   a radio frequency (RF) signal generator configured to generate RF excitation pulses in a volume of anatomy and provide subsequent acquisition of associated RF echo data; and
   a magnetic field gradient generator configured to generate slice select magnetic field gradients for phase encoding and readout RF data acquisition in the volume of anatomy, the RF signal generator and the gradient generator configured;
   a plurality of RF coils configured to acquire a plurality of two dimensional slices of an image; and
   a controller configured to cause the plurality of RF coils to concurrently acquire longitudinal relaxation time ($T_1$) image data of a plurality of different two dimensional slices within the volume of anatomy by causing the RF signal generator and the magnetic field generator to use:
   (i) a preparation pre-scan sequence for acquisition of image calibration data for use in separating concurrently acquired multiple slice $T_1$ map data into separate slices;

(ii) a non-selective inversion recovery pulse to invert longitudinal magnetization in the volume of anatomy;

(iii) an excitation RF pulse applied to said plurality of different two dimensional slices in the volume of anatomy to rotate a portion of longitudinal magnetization in a transverse direction; and (iv) echo-planar-imaging (EPI) acquisition sampling of $T_1$ map data of individual slices of the plurality of slices in response to the application of the excitation RF pulse.

12. The image system according to claim 11, wherein the image calibration data is acquired for each slice separately to estimate a k-space data kernel used to separate the concurrently acquired multiple slice $T_1$ map data into the separate slices.

13. The image system according to claim 11, wherein the RF signal generator and the gradient generator acquire $T_1$ map image data of the plurality of different two dimensional slices within said volume of anatomy during individual TI times for a plurality of successive TI times during an inversion recovery time of said volume of anatomy to provide image data representing a plurality of successive images of an individual slice during the inversion recovery time.

14. The image system according to claim 13, further comprising an image data processor configured to: (i) process data for a plurality of individual pixel locations for each of the plurality of successive images; and (ii) process individual luminance data values of an individual pixel location occurring within the plurality of successive images to provide a composite individual pixel luminance value and a composite $T_1$ map.

15. The image system according to claim 11, further comprising an image data processor configured to fit a kernel to each slice of a pre-scan calibration dataset acquired one slice at a time and apply each kernel fit to each slice to estimate the k-space data of each individual imaging slice from collapsed slices.

16. The image system according to claim 11, wherein the RF signal generator and the gradient generator concurrently acquire $T_1$ map image data in response to a signal indicating a start of introduction of a contrast agent into a patient vessel.

17. The image system according to claim 11, further comprising a display processor configured to generate a display image showing images representing individual slices of the plurality of slices aligned with a common timeline facilitating comparison of the plurality of slices.

18. The image system according to claim 11, wherein the RF signal generator and the gradient generator concurrently acquire $T_1$ map image data for a plurality of different non-selective inversion recovery pulses.

19. An article of manufacture for operating a multi-slice, multi-segment magnetic resonance (MR) imaging system, the article of manufacture comprising a non-transitory, tangible computer-readable medium holding computer-executable instructions for performing a method comprising:

generating radio frequency (RF) excitation pulses in a volume of patient anatomy to provide subsequent acquisition of associated RF echo data;

generating slice select magnetic field gradients for phase encoding and readout RF data acquisition in the patient anatomy;

concurrently acquiring $T_1$ map image data of a plurality of two dimensional slices of an image by an acquisition process comprising:

(i) acquiring image calibration data using a pre-scan sequence;

(ii) inverting a longitudinal magnetization in the volume of patient anatomy using a non-selective inversion recovery pulse;

(iii) applying an excitation RF pulse to a plurality of different two dimensional slices in the volume of patient anatomy to rotate a portion of the longitudinal magnetization in a transverse direction;

(iv) sampling individual slice image data of the plurality of two dimensional slices in response to applying the excitation RF pulse; and (v) separating the concurrently acquired $T_1$ map image into separate slices.

20. The article of manufacture of claim 19, wherein acquiring the image calibration data using the pre-scan sequence further comprises acquiring each slice separately to estimate a k-space data kernel that separates the concurrently acquired $T_1$ map image data into the separate slices.

* * * * *